(12) United States Patent
Ahn et al.

(10) Patent No.: US 10,679,546 B2
(45) Date of Patent: Jun. 9, 2020

(54) TIMING CONTROLLER, DISPLAY APPARATUS HAVING THE SAME AND SIGNAL PROCESSING METHOD THEREOF (71) Applicant: SAMSUNG DISPLAY CO., LTD., Yongin-si, Gyeonggi-Do (KR)

(72) Inventors: Ik-Hyun Ahn, Cheonan-si (KR); Jae-Hyoung Park, Asan-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 4 days.

(21) Appl. No.: 15/948,483

(22) Filed: Apr. 9, 2018

(65) Prior Publication Data
US 2018/0226013 A1 Aug. 9, 2018

Related U.S. Application Data (62) Division of application No. 12/181,522, filed on Jul. 29, 2008.

(30) Foreign Application Priority Data

Feb. 13, 2008 (KR) ........................ 10-2008-0013093

(51) Int. Cl.
G09G 3/20 (2006.01)
H03K 9/08 (2006.01)
G09G 3/36 (2006.01)

(52) U.S. Cl.
CPC ............. G09G 3/2096 (2013.01); H03K 9/08 (2013.01); G09G 3/3648 (2013.01);
(Continued)

(58) Field of Classification Search
CPC ...... G09G 3/2096; G09G 3/20; G09G 3/3648; G09G 2310/0232; G09G 2310/061; G09G 2310/0247; H03K 9/08
See application file for complete search history.

(56) References Cited

U.S. PATENT DOCUMENTS 5,844,538 A 12/1998 Shiraki et al.
7,079,097 B2 * 7/2006 Lee ..................... G09G 3/3614
345/691
(Continued)

FOREIGN PATENT DOCUMENTS

KR 20-1997-0050485 8/1997
KR 1020000038775 7/2000
KR 1020050067622 7/2005

OTHER PUBLICATIONS

U.S. Office Action dated Jul. 8, 2019 in Corresponding U.S. Appl. No. 12/181,522.

Primary Examiner — Jeff Piziali
(74) Attorney, Agent, or Firm — F. Chau & Associates, LLC (57) ABSTRACT A timing controller includes a count control circuit, a pulse width detector, and a pulse generator. The count control circuit receives an external enable signal. Pulses of the external enable signal include an effective and a blank period of image data. The count control circuit counts pulse widths of each of the pulses. The pulse width detector receives the counted pulse widths, compares a pulse width of a present pulse with pulse widths of previous pulses, and detects a pulse width of a previous pulse that has a pulse width smaller than the pulse width of the present pulse. The pulse generator generates three output pulses having pulse widths that are one-third a period of the detected previous pulse. The pulse generator outputs the first, second and third pulses as an internal enable signal.

10 Claims, 7 Drawing Sheets (52) U.S. Cl.
CPC ............... *G09G 2310/0232* (2013.01); *G09G 2310/061* (2013.01); *G09G 2320/0247* (2013.01)

(56) References Cited

U.S. PATENT DOCUMENTS

| | | | | |
|---|---|---|---|---|
| 2001/0020951 | A1* | 9/2001 | Onagawa | G06F 3/14 |
| | | | | 345/696 |
| 2002/0063670 | A1* | 5/2002 | Yoshinaga | G09G 3/3413 |
| | | | | 345/87 |
| 2004/0119671 | A1 | 6/2004 | Kim et al. | |
| 2005/0017960 | A1 | 1/2005 | Nishimura | |
| 2005/0041006 | A1 | 2/2005 | Lee et al. | |
| 2005/0156865 | A1 | 7/2005 | Suh | |
| 2006/0125742 | A1* | 6/2006 | Sekiguchi | G09G 3/3406 |
| | | | | 345/80 |
| 2007/0008277 | A1 | 1/2007 | Okumura et al. | |
| 2007/0152945 | A1* | 7/2007 | Park | G09G 3/3413 |
| | | | | 345/98 |
| 2008/0042936 | A1* | 2/2008 | Wang | G09G 3/32 |
| | | | | 345/76 |
| 2008/0106535 | A1 | 5/2008 | Kim et al. | |
| 2008/0158234 | A1* | 7/2008 | Kim | G09G 3/2096 |
| | | | | 345/501 |
| 2008/0231616 | A1* | 9/2008 | Kim | G09G 3/3614 |
| | | | | 345/204 |
| 2009/0128540 | A1* | 5/2009 | Hsu | G09G 3/3611 |
| | | | | 345/213 |
| 2009/0201272 | A1 | 8/2009 | Ahn et al. | |
| 2009/0237391 | A1* | 9/2009 | Yanagi | G09G 5/18 |
| | | | | 345/213 |

* cited by examiner

TIMING CONTROLLER, DISPLAY APPARATUS HAVING THE SAME AND SIGNAL PROCESSING METHOD THEREOF

CROSS-REFERENCE TO RELATED APPLICATION

This application is a divisional application of U.S. application Ser. No. 12/181,522 filed Jul. 29, 2018, which claims priority to Korean Patent Application No. 10-2008-0013093, filed on Feb. 13, 2008, the disclosures of which are incorporated by references in their entirety herein.

BACKGROUND

1. Technical Field

The present disclosure relates to a timing controller that generates control signals in response to an external data enable signal, a display apparatus having the timing controller, and a signal processing method of the timing controller.

2. Discussion of Related Art

A flat-panel display, such as a liquid crystal display, may include a timing controller, a driving IC, and a display panel. The driving IC applies a data signal corresponding to an image to the display panel in response to control signals. The display panel displays the image in response to the data signal. The timing controller generates the control signals in response to a data enable signal DE applied from an external device. The timing controller modifies image data received from the external device into image data that is suitable for the flat-panel display.

Figure 1:
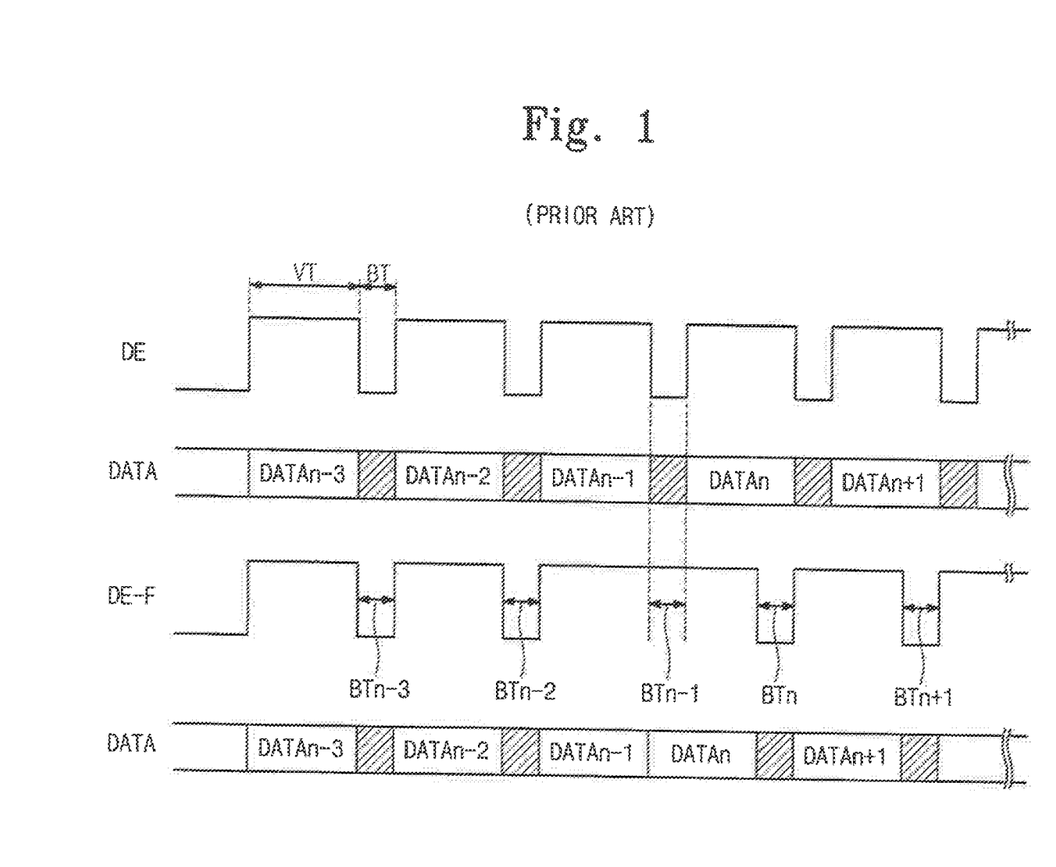
FIG. 1 illustrate waveforms diagram showing a normal enable signal and an abnormal enable signal.

As shown in FIG. 1, the data enable signal DE includes an effective period VT of the image data and a blank period BT of the image data. During the effective period VT of the data enable signal DE, the timing controller applies the image data to the driving IC and generates the control signals that control a timing of the image data. During the blank period BT of the data enable signal DE, the timing controller does not apply the image data to the driving IC and does not generate the control signals. The display panel does not display an image during the blank period BT of the data enable signal DE.

However, as shown in FIG. 1, when a data enable signal DE-F is abnormally generated to have a logic high level in an (n−1)th blank period BTn−1, the driving IC in the display apparatus is driven with the second data waveform DATA shown in FIG. 1. An image corresponding to an n-th image data DATAn is momentarily displayed on the display panel in the (n−1)th blank period BTn−1.

Accordingly, the n-th image data DATAn is displayed on the display panel as an abnormal image, which reduces the display quality of the display apparatus.

Thus, there is a need for systems or methods that can improve the display quality of a display apparatus by reducing or eliminating the number of abnormally displayed images.

SUMMARY

In an exemplary embodiment of the present invention, a timing controller includes a count control circuit, a pulse width detector, and a pulse generator. The count control circuit counts a period of each pulse of an external enable signal. The pulse width detector detects a period of a previous pulse that has a period smaller than the period of the present pulse. The pulse generator generates first, second and third output pulses from the present pulse. A period of each of the first, second, and third output pulses is one-third a period of the detected previous pulse.

In an exemplary of the present invention, a display apparatus includes the timing controller and a panel module. The panel module includes a display panel and a driver. The display panel displays an image in response to an image data, and the driver controls the display panel in response to a plurality of control signals.

In an exemplary embodiment of the present invention, a method of processing a signal of a timing controller is provided as follows. Periods of a plurality of pulses of an enable signal of the timing controller are counted. Each of the pulses includes an effective period and a blank period of image data. A period of a present pulse is compared with periods of previous pulses. When a period of a previous pulse that has a period smaller than the period of the present pulse is detected, first, second and third output pulses are generated as an internal enable signal from the present pulse. A period of each of the first, second and third output pulses is one-third a period of the detected previous pulse. The control signals are generated in response to the generated internal enable signal.

An exemplary embodiment of the present invention includes a method for driving a liquid crystal display. The method includes, for a current pulse of a plurality of consecutive pulses of an enable signal, determining a first number of clocks of a reference clock signal that corresponds to a first prior pulse of the consecutives pulses that is prior to the current pulse, determining a second number of clocks of the reference clock signal that corresponds to a second prior pulse of the consecutives pulses that is prior to the current pulse, dividing the lesser of the first and second number of clocks by ⅓ to generate a divided clock signal, generating a new enable signal from the enable signal and the divided clock signal, and outputting a plurality of control signals to the liquid crystal display in response to the new enable signal. The control signals may be used to control a timing of image data output to the liquid crystal display. Each pulse of the enable signal may include an effective period that corresponds to display data of the image data and a blank period that corresponds non-displayable data of the image data. The new enable signal may be generated to include three pulses that correspond respectively to red, green, and blue data of the image data.

BRIEF DESCRIPTION OF THE DRAWINGS

The present invention will become readily apparent by reference to the following detailed description when considered in conjunction with the accompanying drawings wherein.

DETAILED DESCRIPTION OF EXEMPLARY EMBODIMENTS

Like numbers refer to like elements throughout. Hereinafter, exemplary embodiments of the present invention will be explained in detail with reference to the accompanying drawings.

Figure 2:
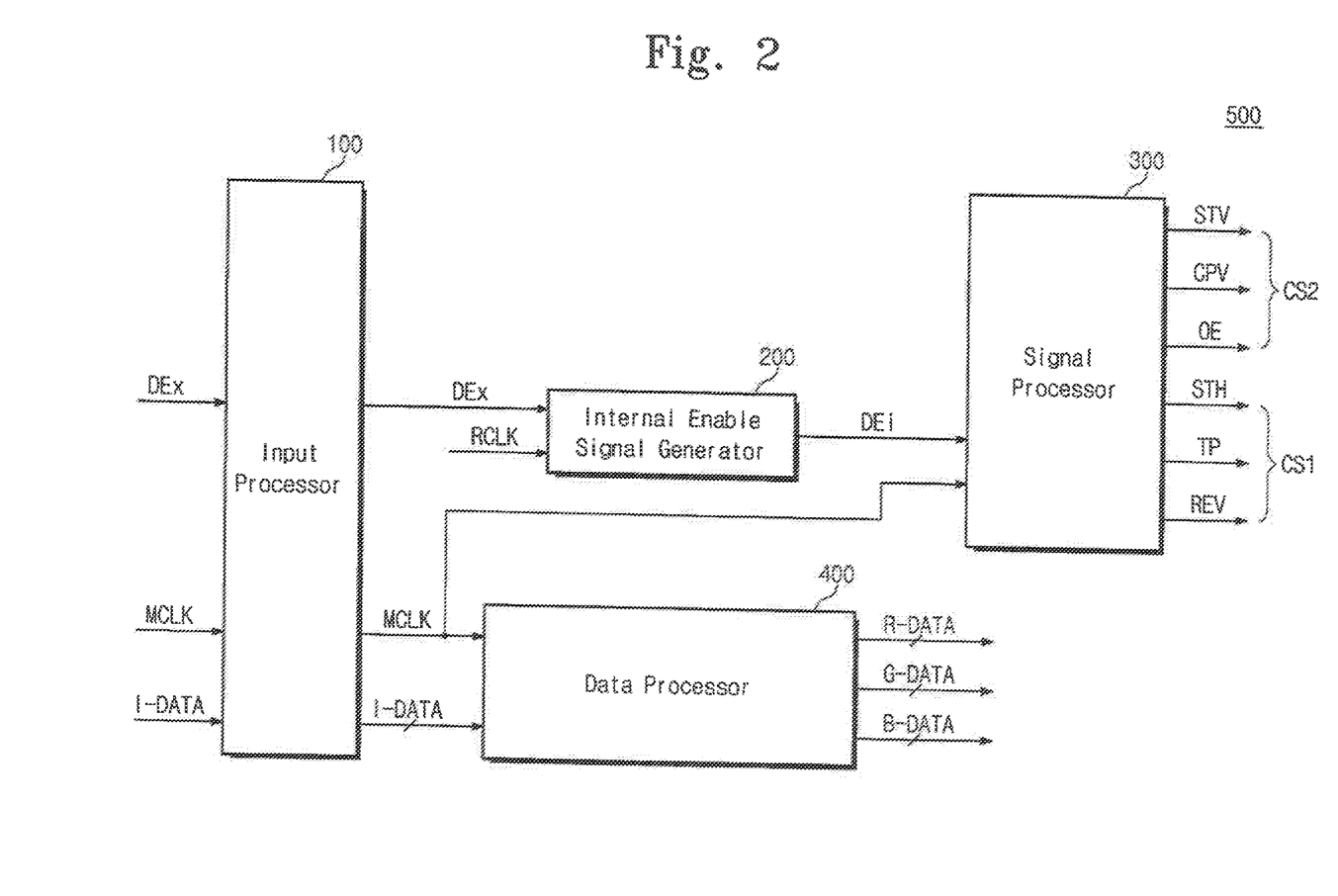
FIG. 2 is a block diagram showing a timing controller according to an exemplary embodiment of the present invention.

FIG. 2 is a block diagram showing a timing controller according to an exemplary embodiment of the present invention. Referring to FIG. 2, a timing controller 500 includes an input processor 100, an internal enable signal generator 200, a signal processor 300, and a data processor 400. The input processor 100 receives an external enable signal DEx, a main clock signal MCLK, and an image data I-DATA from an external device (not shown). The input processor 100 transmits the external enable signal DEx to the internal enable signal generator 200, provides the main clock signal MCLK to the data processor 400 and the signal processor 300, and provides the image data signal I-DATA to the data processor 400. The input processor 100 may serve as an interface that electrically connects the external device and the timing controller 500. The external device may be a computer (not shown) or a graphic controller (not shown). The external enable signal DEx includes a plurality of pulses. Each of the pulses includes an effective period of the image data I-DATA and a blank period of the image data I-DATA.

The internal enable signal generator 200 receives the external enable signal DEx and a reference clock RCLK and changes the external enable signal DEx to an internal enable signal DEi using the reference clock RCLK to output the internal enable signal DEi.

The signal processor 300 outputs a plurality of control signals in response to the internal enable signal DEi to control a timing of the image data I-DATA. The control signals include a first control signal CS1 and a second control signal CS2. The first control signal CS1 may include a horizontal synchronizing start signal STH, a load signal TP, and an inversion signal REV. The second control signal CS2 may include a vertical synchronizing start signal STV, a gate selection signal CPV, and a gate-on enable signal OE. The first and second control signals CS1 and CS2 are applied respectively to data and gate drivers 600 and 700 of FIG. 7.

The data processor 400 receives the main clock signal MCLK and the image data I-DATA through the input processor 100. The data processor 400 changes the image data I-DATA to color data R-DATA, G-DATA, and B-DATA including a red data R-DATA, a green data G-DATA, and a blue data B-DATA and outputs the color data R-DATA, G-DATA, and B-DATA. The color data R-DATA, G-DATA, and B-DATA output from the data processor 400 is applied to the data driver 600 shown in FIG. 7. The data processor 400 outputs the color data R-DATA, G-DATA, and B-DATA to the data driver 600 during an effective period of the internal enable signal DEi that is output from the internal enable signal generator 200. The data processor 400 does not output the color data R-DATA, G-DATA, and B-DATA to the data driver 600 during a blank period of the internal enable signal DEi.

Figure 3:
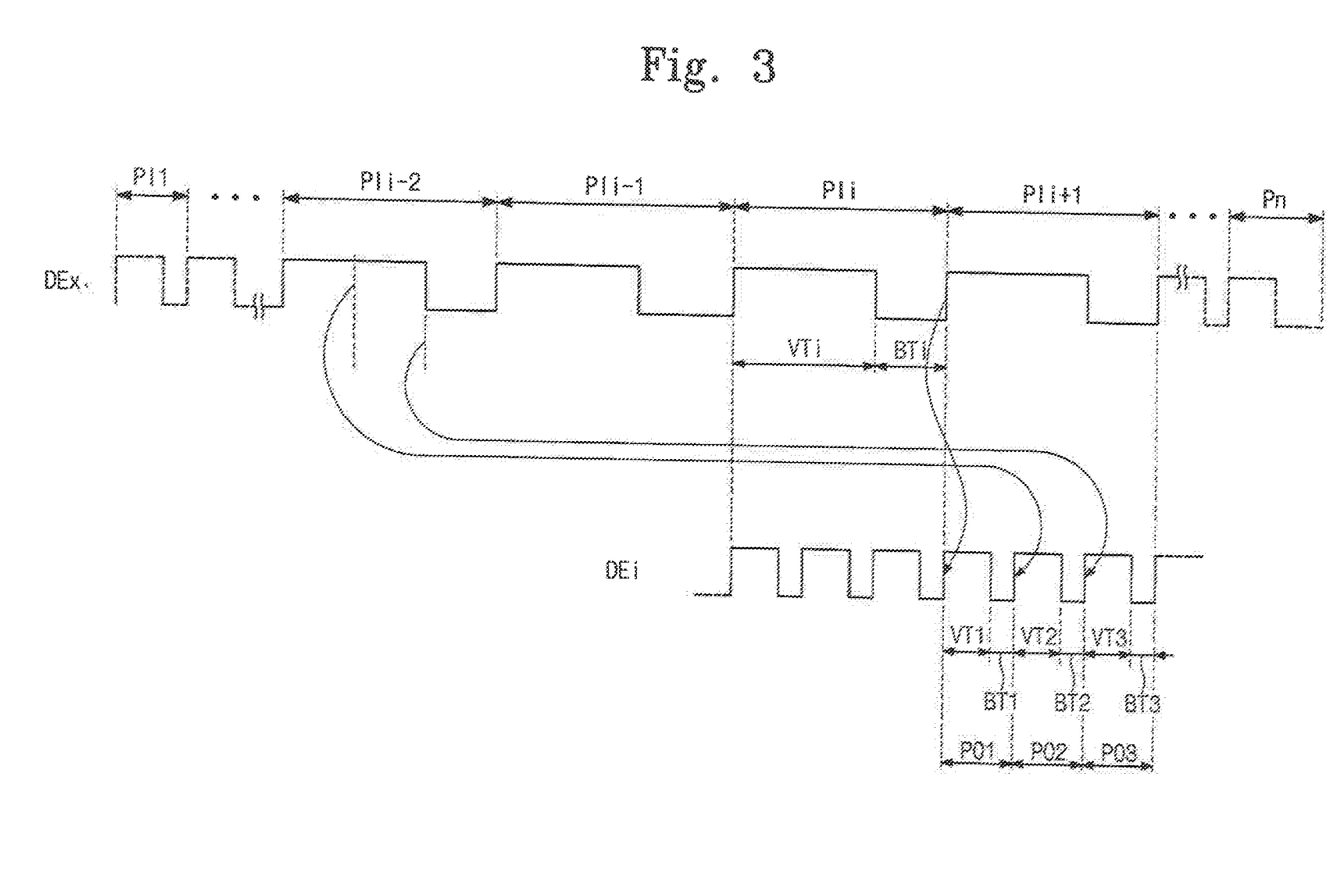
FIG. 3 is a waveform diagram showing an external enable signal input to an internal enable signal generator shown in FIG. 2 and an internal enable signal output from the internal enable signal generator.

FIG. 3 is a waveform diagram showing the external enable signal input to the internal enable signal generator and the internal enable signal output from the internal enable signal generator. Referring to FIG. 3, the external enable signal DEx includes a plurality of pulses PI1~PIn. The pulses PI1~PIn are serially input to the internal enable signal generator 200. Each of the pulses PI1~PIn includes a period that is divided into an effective period and a blank period. The image data I-DATA includes data that can be displayed as an image only during the effective period. For example, the display panel displays an image during the effective period, but not during the blank period.

Three output pulses are generated from the pulses PI1~PIn of the external enable signal DEx using the internal enable signal generator 200. For example, the internal enable signal generator 200 generates a first output pulse PO1, a second output pulse PO2, and a third output pulse PO3 from a present pulse PIi among the pulses PI1~PIn. The first output pulse PO1 includes an effective period VT1 of the red data R-DATA, which is equal to one-third of an effective period VTi of the present pulse PIi, and a blank period BT1 of the red data R-DATA, which is equal to one-third of a blank period BTi of the present pulse PIi. The second output pulse PO2 includes an effective period VT2 of the green data G-DATA, which is equal to one-third of the effective period VTi of the present pulse PIi, and a blank period BT2 of the green data G-DATA, which is equal to one-third of the blank period BTi of the present pulse PIi. The third output pulse PO3 includes an effective period VT1 of the blue data signal B-DATA, which is equal to one-third of the effective period VTi of the present pulse PIi and a blank period BT1 of the blue data B-DATA, which is equal to one-third of the blank period BTi of the present pulse PIi.

The internal enable signal generator 200 generates the first to third output pulses P01, P02, and P03 within one period of a next pulse (e.g., an (i+1)th pulse PIi+1) of the present pulse PIi, Start times of the second and third output pulses P02 and P03 are determined with reference to a period of a previous pulse (e.g., an (i−2)th pulse PIi−2) having a period smaller than a period of the present pulse PIi among previous pulses PI1~PIi−1 that are input prior to the present pulse PIi. For example, the second output pulse P02 starts at a time when the period of the (i−2)th pulse PIi−2 reaches a one-third period of the period thereof. The third output pulse P03 starts at a time when the period of the (i−2)th pulse reaches a two-third period of the period thereof. The first output pulse P01 starts in synchronization with a start time of an (i+1)th pulse PIi+1.

Consequently, a period of each of the first to third output pulses P01, P02, and P03 is set to one-third the period of the previous pulse PIi-2, which has a period smaller than that of the present pulse PIi. The first to third output pulses P01, P02, and P03 are generated within a period of the next pulse PIi+1 of the present pulse PIi and are output from the internal enable signal generator 200. Thus, each of the first to third output pulses P01, P02, and P03 may stably maintain their respective blank periods BT1, BT2, and BT3. For example, since the period of each of the first to third output pulses P01, P02, and P03 is set based on the previous pulse PIi-2 having a period smaller than that of the present pulse PIi, the first to third output pulses P01, P02, and P03 may stably maintain the blank periods BT1, BT2, and BT3, respectively, during the period of the (i+1)th pulse PIi+1.

When the first to third output pulses P01, P02, and P03 are generated with reference to a period of a previous pulse having a period larger than that of the present pulse PIi (e.g., if the first to third pulses are generated with reference to the period of the previous pulse having a blank period smaller than that of the present pulse PIi), the first to third output pulses PO1, PO2, and PO3 may not be able to stably maintain the blank period. This is because the first to third output pulses PO1, PO2, and PO3, which each have a period equal to one-third of the period of the previous pulse PIi-1 that has a period larger than that of the present pulse PIi, are generated within the period of the next pulse.

Figure 4:
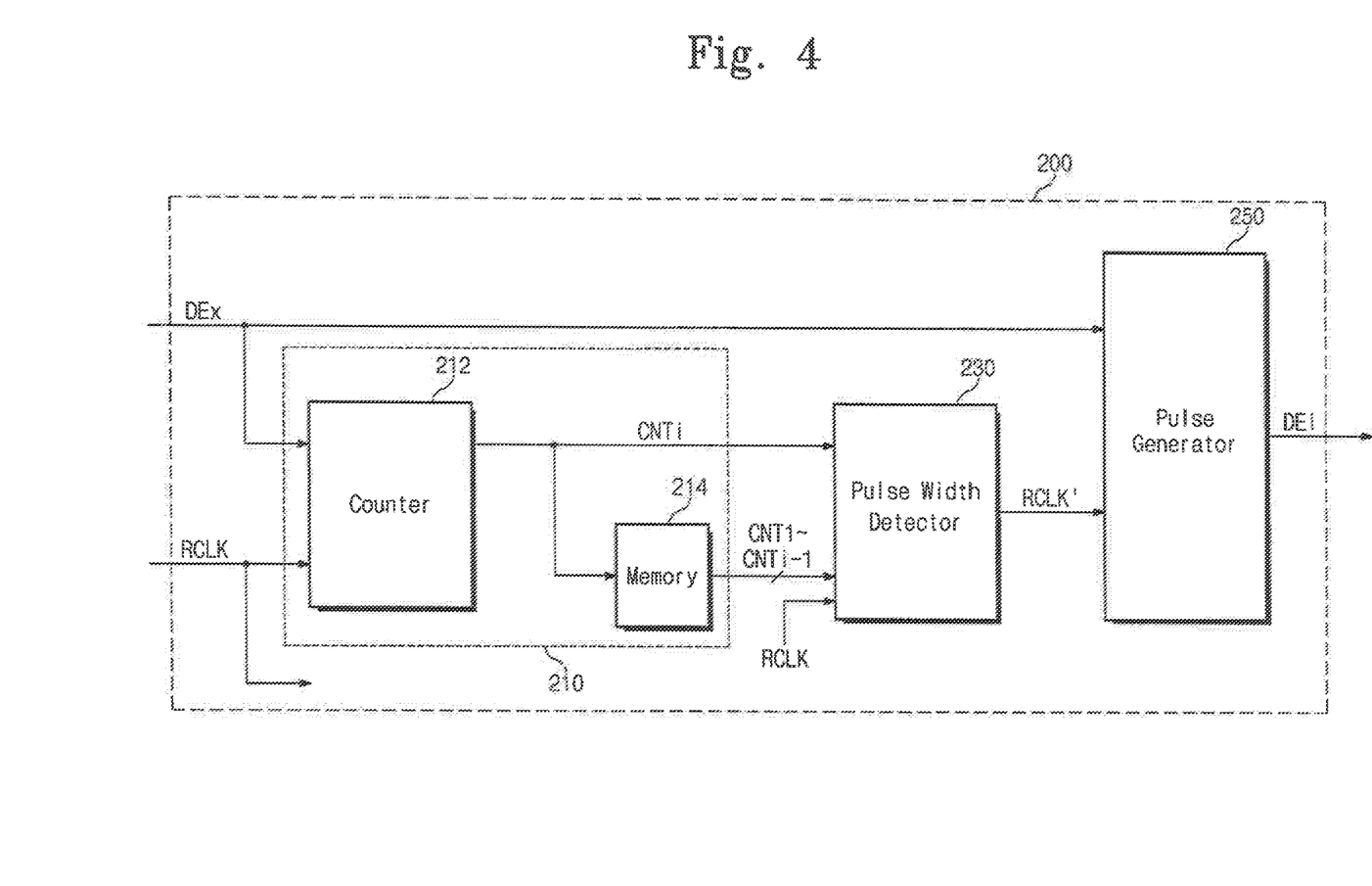
FIG. 4 is a block diagram showing an internal enable signal generator of FIG. 2, according to an exemplary embodiment of the present invention.
Figure 5:
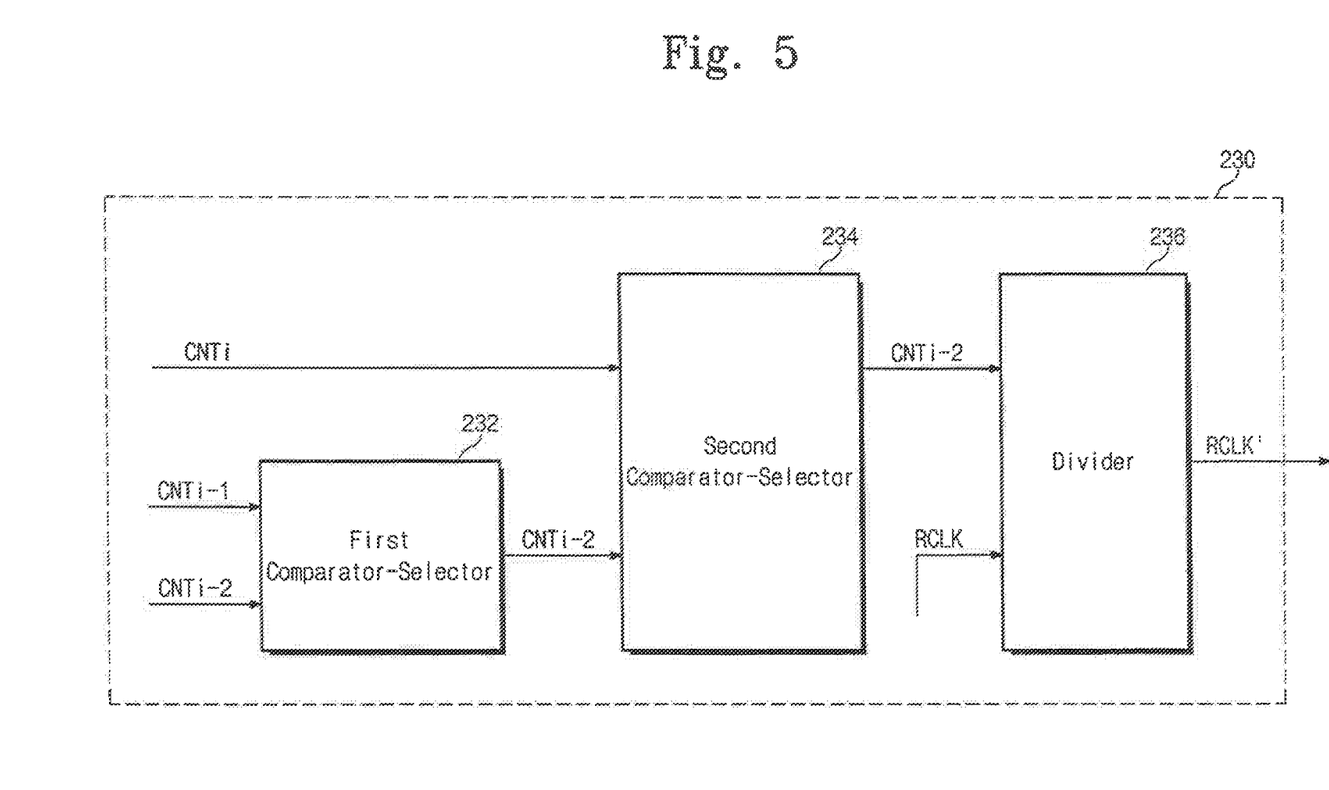
FIG. 5 is a block diagram showing a pulse width detector of FIG. 5, according to an exemplary embodiment of the present invention.

FIG. 4 is a block diagram showing the internal enable signal generator of FIG. 2, and FIG. 5 is a block diagram showing a pulse width detector of FIG. 5, according to an exemplary embodiment of the present invention. Referring to FIGS. 4 and 5, the internal enable signal generator 200 includes a count control circuit 210, a pulse width detector 230, and a pulse generator 250.

The count control circuit 210 includes a counter 212 and a memory 214. The counter 212 receives the external enable signal DEx and the reference clock RCLK. The counter 212 counts the period of each of pulses PI1~PIn of the external enable signal DEx using the number of clocks of the reference clock RCLK. The counter 212 provides the counted result to the memory 214 as counted values CNT1~CNTi. Each of the counted values CNT1~CNTi may be represented by a combination of bits, and a size of each of the periods of the pulses PI1~PIn may be coded. The size of each of the period may be coded as a binary number or a decimal number by the counted values CNT1~CNTi.

The memory 214 sequentially stores the counted values CNT1~CNTi in the order that they are output from the counter 212. The memory 214 outputs previous counted values CNT1~CNTi-1, each corresponding to the previous pulses (e.g., PI1~PIi-1 of FIG. 3), in response to the counted value CNTi corresponding to the present pulse (e.g., PIi of FIG. 3) of the external enable signal DEx. The counted values CNT1~CNTi are provided to the pulse width detector 230. In at least one embodiment of the present invention, the memory 214 outputs two counted values in response to an i-th counted value CNTi. The two counted values includes the counted value CNTi-1 of the previous pulse PIi-1 that is input sequentially before the present pulse PIi and the counted value CNTi-2 of the previous pulse PIi-2 that is input sequentially before the previous pulse PIi-1. The memory 214 may be, for example, a register, a first-in-first-out (FIFO) memory, a random access memory (RAM), or a combination of the above-mentioned devices. Manufacturing costs may be reduced when the memory employs either the register or the FIFO.

The pulse width detector 230 receives the counted values CNTi, CNTi-1, and CNTi-2 from the counter control circuit 210. The pulse width detector 230 can detect whether a counted value is lower than the counted value CNTi of the present pulse PIi among the counted values CNTi-1 and CNTi-2 of the previous pulses PIi-1 and PIi-2. Hereinafter, the CNTi-1 is referred to as the (i-1)th counted value, and the CNTi-2 is referred to as the (i-2)th counted value.

The pulse width detector 230 may include a first comparator-selector 232, a second comparator-selector 234, and a divider 236. Referring to FIGS. 4 and 5, the first comparator-selector 232 receives the (i-1)th counted value CNTi-1 and the (i-2)th counted value CNTi-2 and selects either the (i-1)th counted value CNTi-1 or the (i-2)th counted value CNTi-2 that has a relatively smaller counted value. The first comparator-selector 232 may be a logic circuit that executes a comparison algorithm and a selection algorithm. In at least one embodiment of the present invention, the present pulse indicates a pulse input to the second comparator-selector 234 in a present stage and represents the i-th pulse PIi, where i is a natural number, which may be greater than equal to 3. Therefore, the (i-1)th pulse PIi-1 may be input sequentially before the present pulse PIi.

For example, when the number of clocks of the reference clock RCLK corresponding to the period of the (i-2)th pulse PIi-2 is smaller than the number of clocks of the reference clock RCLK corresponding to the period of the (i-1)th pulse PIi-1, the first comparator-selector 232 selects the (i-2)th counted value CNTi-2 to output the (i-2)th counted value CNTI-2. The (i-2)th counted value CNTi-2 is provided to the second comparator-selector 234.

The second comparator-selector 234 receives the (i-2)th counted value CNTi-2 and the i-th counted value CNTi and selects either the (i-2)th counted value CNTi-2 or the i-th counted value CNTi that has a relatively smaller counted value. The second comparator-selector 234 may be a logic circuit that executes a comparison algorithm and a selection algorithm.

When the (i-2)th counted value CNTi-2 is smaller than the i-th counted value CNTi, (e.g., if the period of the (i-2)th pulse PIi-1 is smaller than that of the present pulse PIi) the second comparator-selector 234 selects the (i-2)th counted value CNTi-2 and outputs the (i-2)th counted value CNTi-2. The (i-2)th counted value CNTi-2 output from the second comparator-selector 234 is applied to the divider 236. When the (i-2)th counted value CNTi-2 is larger than the i-th counted value CNTi, (e.g., if the period of the (i-2)th pulse PIi-2 is larger than that of the present pulse PIi) the second comparator-selector 234 does not output a counted value and maintains a standby state until a next counted value is provided from the first comparator-selector 232. The next counted value indicates either an (i-3)th counted value or an (i-4)th counted value that has a relatively smaller counted value.

The divider 236 receives a counted value that is output from the second comparator-selector 234, for example, the (i-2)th counted value CNTi-2 and the reference clock RCLK. The divider 236 detects a reference clock RCLK corresponding to the (i-2)th pulse PIi-2 from the (i-2)th counted value CNTi-2 and frequency-divides the detected reference clock RCLK by ⅓ to generate a clock RCLK' including a first clock RCLK1', a second clock RCLK2', and a third clock RCLK3' that are successive in time.

Referring to FIGS. 2 and 4, the pulse generator 250 generates first to third output pulses P01, P02, and P03 from the present pulse PIi using the dock RCLK'. The first to third output pulses P01, P02, and P03 are output from the pulse generator 250 as the internal enable signal DEi. A period of each of the first to third output pulses P01, P02, and P03 is one-third the period of the detected previous pulse, for example, (i-2)th pulse PIi-2.

As shown in FIG. 3, the output pulses PO1, PO2, and PO3 are successively generated in time within the period of the (i+1)th pulse PIi+1. The second output pulse PO2 starts in synchronization with a start time of the second clock RCLK2' of the ⅓ frequency-divided clock RCLK'. The third output pulse PO3 starts in synchronization with a start time of the third clock RCLK3'. The first output pulse PO1 starts in synchronization with a start time of the (i+1)th pulse PIi+1.

Figure 6:
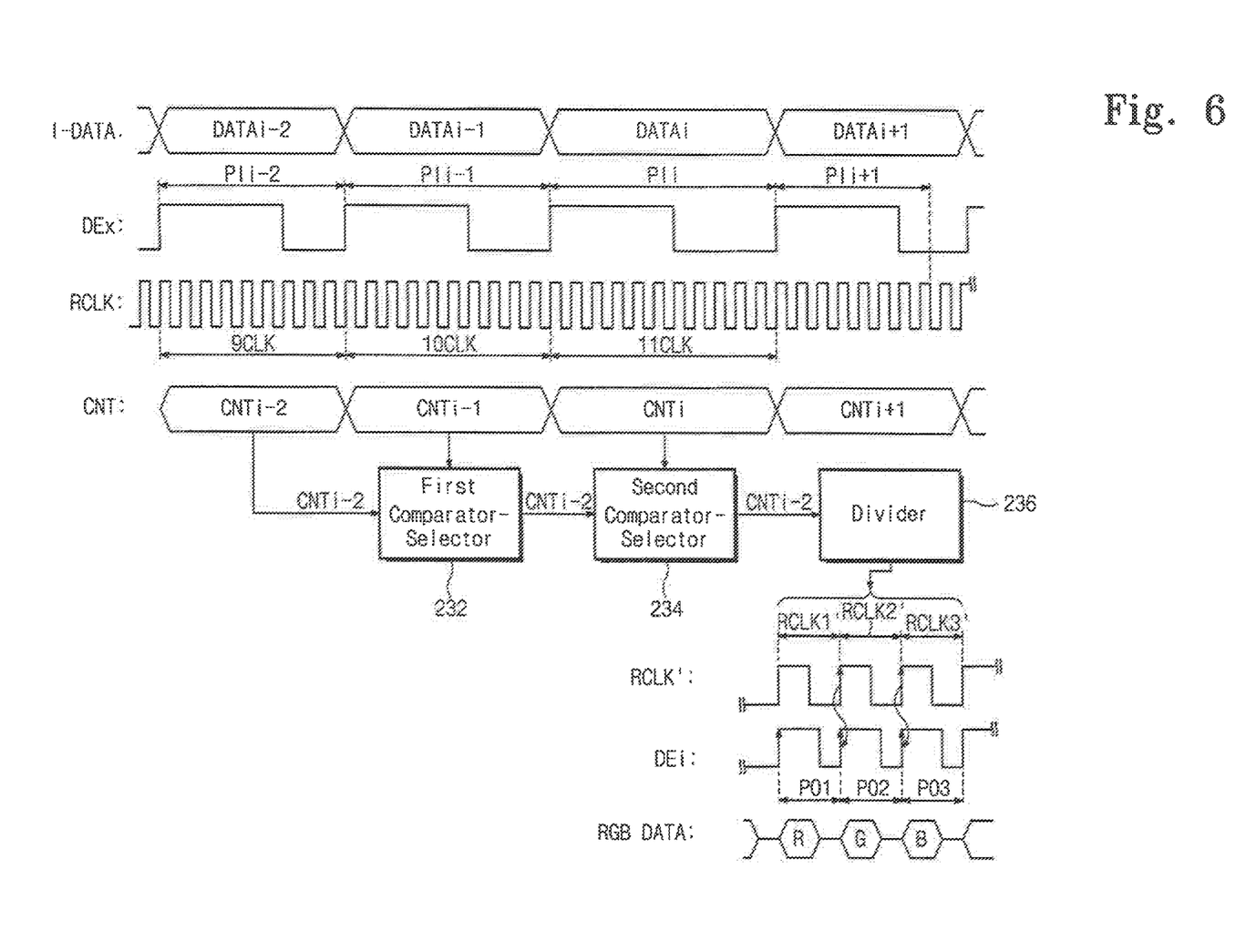
FIG. 6 is a timing diagram illustrating an operation of the internal enable signal generator of FIG. 2.

FIG. 6 is a timing diagram illustrating an operation of the internal enable signal generator of FIG. 2. Referring to FIGS. 2, 3, and 6, the image data I-DATA and the external enable signal DEx, which includes the pulses, are input to the timing controller 500 from the external device.

The pulses of the external enable signal DEx are serially input to the internal enable signal generator 200 through the input processor 100 of the timing controller 500. The count control circuit 210 of the internal enable signal generator 200 counts the number of clocks of each pulse P to determine a period of each pulse P. In one embodiment of the present invention, it is assumed that a number of clocks of the i-th pulse Pli is 11 clocks, a number of clocks of the (i−1)th pulse Pli−1 is 10 clocks, and a number of clocks of the (i−2)th pulse Pli−2 is 9 clocks. However, the present invention is not limited to clocks ranging between 9 and 11 clocks, as a varying range of clocks may be used. The counted value CVT of each pulse may be coded as a combination of bits for storage in the memory 214.

The memory 214 outputs the counted values CNTi−1 and CNTi−2 respectively corresponding to the (i−1)th pulse Pli−1 and the (i−2)th pulse Pli−2 (hereinafter, referred to as "previous pulses") in response to the counted value CNTi corresponding to the i-th pulse (hereinafter, referred to as "present pulse"). The counted values CNTi−1 and CNTi−2 of the previous pulses Pli−1 and Pli−2 are applied to the first comparator-selector 232 of the pulse width detector 230. The first comparator-selector 232 selects either the counted value CNTi−1 or the counted value CNTi−2 that has a relatively smaller counted value to output the selected counted value. Since the number of clocks (e.g., 9 clocks) of the reference clock RCLK corresponding to the (i−2)th pulse Pli−2 is smaller than the number of clocks (e.g., 10 clocks) of the reference clock RCLK corresponding to the (i−1)th pulse Pli−1, the first comparator-selector 232 selects the counted value CNTi−2 of the previous pulse Pli−2 between the previous pulses Pli−1 and Pli−2 and outputs the counted value CNTi−2.

The second comparator-selector 234 selects either the counted value CNTi−2 of the previous pulse Pli−2 or the counted value CNTi of the present pulse Pli that has a relatively smaller counted value. Since the number of clocks (e.g., 9 clocks) of the reference clock RCLK corresponding to the previous pulse Pli−2 is smaller than the number of clocks (e.g., 11 clocks) of the reference clock RCLK corresponding to the present pulse Pli, the second comparator-selector 234 selects the counted value CNTi−2 of the previous pulse Pi−2 to output the counted value CNTi−2. Then, the divider 236 detects the number of clocks of the reference clock RCLK corresponding to the previous pulse Pli−2 from the counted value CNTi−2 of the previous pulse Pli−2 and frequency-divides the detected reference clock RCLK by ⅓ to output a ⅓-frequency-divided reference clock RCLK'. The ⅓-frequency-divided reference clock RCLK' includes a first clock RCLK1', a second clock RCLK2', and a third clock RCLK3'.

The pulse generator 250 generates the first output pulse PO1, the second output pulse PO2, and the third output pulse PO3 using the ⅓-frequency-divided reference clock RCLK' that includes the first to third clocks RCLK1', RCLK2', and RCLK3' to output the first to third output pulses PO1, PO2, and PO3. For example, the second output pulse PO2 is generated in synchronization with the start time of the second clock RCLK2', i.e., a time where the second clock is toggled from a low level to a high level, and the third output pulse PO3 is generated in synchronization with the start time of the third clock RCLK3', i.e., a time where the third clock is toggled from a low level to a high level. The first output pulse PO1 is generated in synchronization with the start time of the next pulse Pli+1 of the present pulse Pli, i.e., a time where the next pulse of the present pulse is toggled from a low level to a high level. The internal enable signal generator 200 outputs the first to third output pulses PO1, PO2, and PO3 as the internal enable signal DEi.

Figure 7:
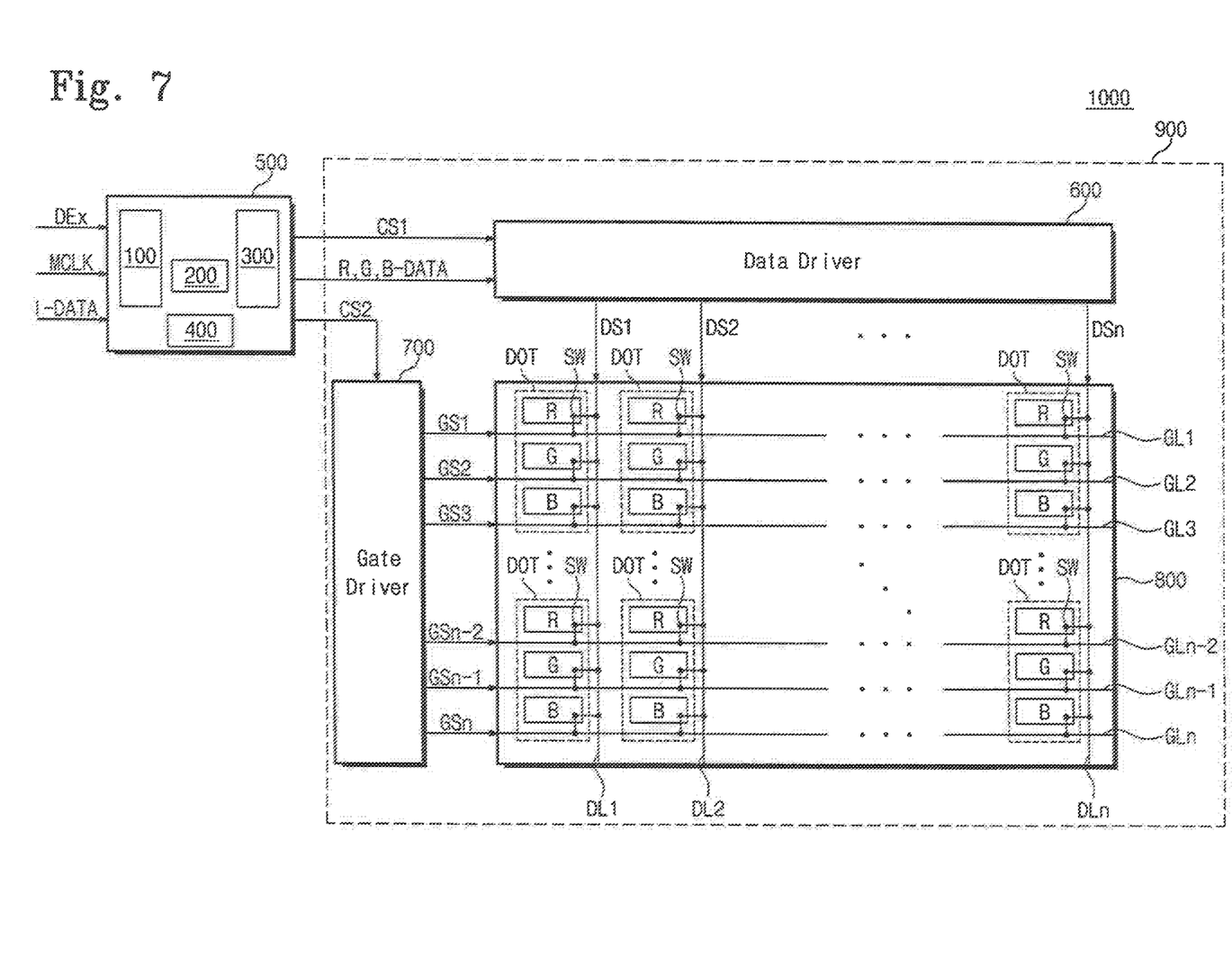
FIG. 7 is a block diagram showing a display apparatus according to an exemplary embodiment of the present invention.

FIG. 7 is a block diagram showing a display apparatus according to an exemplary embodiment of the present invention that employs the timing controller of FIG. 2. In FIG. 7, the same reference numerals denote the same elements in FIG. 2, and thus the detailed descriptions of the same elements are not needed.

Referring to FIG. 7, a display apparatus 1000 includes the timing controller 500 and a panel module 900. The timing controller 500 receives the external enable signal DEx, the main clock signal MCLK, and the image data I-DATA. The timing controller 500 changes the external enable signal DEx to the internal enable signal DEi through the signal processing method as described above in detail with reference to FIGS. 2 to 6. The timing controller 500 changes the image data I-DATA to the color data having the red data R-DATA, the green data G-DATA, and the blue data B-DATA based on the internal enable signal DEi. The red, green and blue data R-DATA, G-DATA, and B-DATA are applied to the panel module 900 in synchronization with the main clock signal MCLK. The timing controller 500 generates the first control signal CS1 and the second control signal CS2 based on the internal enable signal DEi generated during the internal signal processing. The first and second control signals CS1 and Cs2 are provided to the panel module 900.

The panel module 900 includes the data driver 600, the gate driver 700, and a liquid crystal display panel 800. The data driver 600 changes the color data R-DATA, G-DATA, and B-DATA to a plurality of data signals DS1~DSn in an analog format in response to the first control signal CS1 and provides the data signals DS1~DSn to the display panel 800. The first control signal CS1 includes a horizontal start signal STH indicating a start of the data signals DS1~DSn, an inversion signal REV inverting a polarity of the data signals DS1~DSn, and a load signal TP indicating an output of the data signals DS1~DSn to the data driver 600.

The gate driver 700 sequentially outputs a plurality of gate signals GS1~GSn in response to the second control signal CS2. The gate signals GS1~GSn are applied to the display panel 800. The second control signal CS2 includes a scan start signal indicating an output of the gate signals GS1~GSn to the gate driver 700, a scan clock signal sequentially outputting the gate signals GS1~GSn from the gate driver 700, and an output enable signal enabling an output of the gate driver 700.

The display panel 800 includes a plurality of gate lines GL1~GLn, a plurality of data lines DL1~DLn, a plurality of switching elements SW, and a plurality of dots DOT. The gate lines GL1~GLn extend in parallel to each other and sequentially receive the gate signals GS1~GSn. The data lines DL1~DLn are insulated from and cross the gate lines GL1~GLn and receive the data signals DS1~DSn. The switching elements SW are electrically connected to the gate lines GL1~GLn and the data lines DL1~DLn, respectively.

The dots DOT are electrically connected to the gate lines GL1~GLn and the data lines DL1~DLn through the switching elements (not shown). Each dot DOT receives a corresponding data signal of the data signals DS1~DSn and a corresponding gate signal of the gate signals GS1~GSn. Each dot DOT includes a red pixel R, a green pixel G, and blue pixel B. A data signal corresponding to the red data R-DATA is applied to the red pixel R, a data signal corresponding to the green data G-DATA is applied to the green pixel G, and a data signal corresponding to the blue data B-DATA is applied to the blue pixel B. Each of the red, green, and blue pixels R, G, and B receives a corresponding data signal in accordance with a turn-on operation of a corresponding switching element SW and displays a corresponding image in response to the received data signal.

Referring to FIG. 7, each red pixel R, green pixel G, and blue pixel B are arranged along a longitudinal direction of the data line. However, the red, green, and blue pixels R, G, and B may be arranged in many different ways and should not be limited to the direction of the exemplary embodiment illustrated in FIG. 7.

According to at least one exemplary embodiment of the present invention, a timing controller receives an external present pulse, generates first, second and third output pulses based on the previous pulse having a period smaller than the period of the present pulse, and outputs the first to third output pulses as an internal enable signal. Thus, a display apparatus may stably maintain a blank period of image data and prevent the image from being displayed during the blank period of the image data, thereby improving a display quality of the display apparatus.

While exemplary embodiments of the present invention have been described, it is understood that the present invention is not limited to these exemplary embodiments, but various changes and modifications can be made by one ordinary skilled in the art within the spirit and scope of the present invention.

What is claimed is:

1. A timing controller comprising:
    a count control circuit configured to receive a first enable signal, the first enable signal including a first input pulse and a plurality of second input pulses, wherein the second input pulses are provided to the count control circuit prior to the first input pulse being provided to the count control circuit, the second input pulses are consecutive, the first input pulse is consecutive to a last input pulse of the second input pulse, and the count control circuit is configured to determine a first period of the first input pulse and second periods of the second input pulses;
    a pulse width detector configured to compare each of the second periods against the first period to identify one period among the second periods that is smaller than the first period; and
    a pulse generator configured to generate each of a first output pulse, a second output pulse and a third output pulse, after the first input pulse has been provided to the count control circuit, wherein a period of each of the first output pulse, the second output pulse, and the third output pulse, is one-third a period of the identified one period, wherein the pulse generator outputs the first output pulse, the second output pulse and the third output pulse as a second enable signal, and the and the first output pulse, the second output pulse and the third output pulse are consecutive, wherein the first enable signal is provided by a source external to the timing controller and the second enable signal is generated within the timing controller.

2. The timing controller of claim 1, wherein the pulse generator is configured to output the first output pulse at a time that is in synchronization with a start time of a third input pulse of the first enable signal, output the second output pulse after outputting the first output pulse, output the third output pulse after outputting the second output pulse, and a sum of a period of the first output pulse, a period of the second output pulse, and a period of the third output pulse corresponds to a period of the third input pulse, wherein the third input pulse is provided to the count control circuit after the first input pulse is provided to the count control circuit.

3. The timing controller of claim 1, wherein the first input pulse and each of the second input pulses includes an effective period of image data and a blank period of the image data.

4. The timing controller of claim 3, wherein the blank period of one of the second input pulses having the identified one period is smaller than the blank period of the first input pulse.

5. The timing controller of claim 1, wherein the count control circuit comprises:
    a counter configured to receive a first reference clock, count a period of the first input pulse to generate the first period, and count a period of the second input pulses to generate the second periods, based on a number of periods of the first reference clock; and
    a memory configured to store the first period and the second periods, and output only the second periods.

6. The timing controller of claim 5, wherein the memory comprises a first-in-first-out memory.

7. The timing controller of claim 5, wherein the pulse width detector comprises:
    a first comparator-selector configured to select a period that is smallest among the second periods;
    a second comparator-selector configured to output the selected period upon determining that the selected period is smaller than the first period; and
    a divider configured to detect a second reference dock corresponding to one of the second input pulses having the output selected period, and frequency-divides the detected second reference dock by ⅓ to output a divided reference clock.

8. The timing controller of claim 3, wherein the image data comprises red data, green data, and blue data, and the first output pulse comprises an effective period of the red data and a blank period of the red data, the second output pulse comprises an effective period of the green data and a blank period of the green data, and the third output pulse comprises an effective period of the blue data and a blank period of the blue data.

9. The timing controller of claim 1, wherein the first input pulse is immediately consecutive to the second input pulses, wherein the second input pulses are immediately consecutive pulses, and wherein the first output pulse, the second output pulse, and the third output pulse are immediately consecutive pulses.

10. The timing controller of claim 1, wherein the timing controller receives image data, each of the output pulses includes an effective period of the image data and a blank period of the image data, the timing controller applies the image data to a data driver providing data signals to a display panel during the effective period and does not apply the image data to the data driver during the blank period.

* * * * *